United States Patent [19]
Slemmer et al.

[11] Patent Number: 5,121,358
[45] Date of Patent: Jun. 9, 1992

[54] SEMICONDUCTOR MEMORY WITH POWER-ON RESET CONTROLLED LATCHED ROW LINE REPEATERS

[75] Inventors: William C. Slemmer, Dallas; David C. McClure, Carrollton, both of Tex.

[73] Assignee: SGS-Thomson Microelectronics, Inc., Carrollton, Tex.

[21] Appl. No.: 588,609

[22] Filed: Sep. 26, 1990

[51] Int. Cl.$^5$ ............................................. G11C 7/00
[52] U.S. Cl. .................................. 365/226; 365/227; 365/230.03
[58] Field of Search ............... 365/226, 227, 228, 229, 365/230.06, 230.03

[56] References Cited

U.S. PATENT DOCUMENTS 4,104,734  8/1978  Herndon ............................... 365/228
4,262,340  4/1981  Sasaki et al. ..................... 365/230.06
4,631,707  12/1986  Watanabe ............................. 365/226

FOREIGN PATENT DOCUMENTS 58-94187  6/1983  Japan .
193501  6/1983  Japan ............................... 365/230.06

OTHER PUBLICATIONS

Wang et al., "A 21ns 32K×8 CMOS SRAM With a Selectively Pumped P-Well Array", *Digest of Technical Papers, 1987 IEEE International Solid-State Circuits Conference* (IEEE, Feb. 1987), pp. 254, 255 and 415.
Sakurai et al., "A Low Power 46 ns 256 kbit CMOS Static RAM with Dynamic Double Word Line", *IEEE Journal of Solid-State Circuits* (Oct. 1984), vol. SC-19, No. 5, pp. 578-585.

Primary Examiner—Stuart N. Hecker
Assistant Examiner—Jack A. Lane
Attorney, Agent, or Firm—Rodney M. Anderson; Lisa K. Jorgenson; Richard K. Robinson

[57] ABSTRACT

An integrated circuit memory is disclosed which has its memory array divided into blocks, or sub-arrays. Between each sub-array is placed a row line repeater which communicates the row line from the row decoder, or from a prior sub-array, into the next sub-array. The row line repeaters are controlled according to a portion of the column address so that, after the entire selected row has been energized, those row line repeaters which are not associated with the selected sub-array will de-energize the row line at their output. The row line repeaters each include a latch, so that the row line repeater which is associated with the selected sub-array will maintain the selected row line energized. Various embodiments of the row line repeater circuit are disclosed. Further control of the row line repeaters from a power-on reset circuit is also disclosed. A dummy row line is also disclosed, which emulates an actual row line so that the time at which the selected row has been fully energized is more closely known. The dummy row line thus can control the time at which the unselected row line repeaters de-energize their outputs.

13 Claims, 6 Drawing Sheets

SEMICONDUCTOR MEMORY WITH POWER-ON RESET CONTROLLED LATCHED ROW LINE REPEATERS

This invention is in the field of integrated memory circuits, and is more specifically directed to the selection of memory storage cells therein.

This application is related to applications Ser. No. 588,601, Ser. No. 588,577, and Ser. No. 588,600, all filed contemporaneously herewith, and all assigned to SGS-Thomson Microelectronics, Inc.

BACKGROUND OF THE INVENTION

Conventional integrated memory circuits, such as random access memories (RAMs), both of the static type (SRAMs) and dynamic type (dRAMs), read-only memories (ROMs), both of the mask-programmed type and of the electrically programmable type (including PROMs, EPROMs, EEPROMs and EAROMs), and other memories such as dual-port RAMs and FIFOs, are generally organized into rows and columns. This row-by-column organization applies both to the physical arrangement of the memory cells in an array, and also to the electrical operation of the memory itself. Certain ones of the address terminals are used in selection of a row of memory cells in the array, and certain others are used in the selection of a column, providing access to one or more memory cells in the selected row. It should be noted that in dRAMs, the row and column addresses are generally time-multiplexed at the device address terminals.

Where the number of memory cells is quite large, such as on the order of $2^{20}$ storage locations (i.e., 1 Mbits), the physical size of the memory array accordingly becomes quite large, even when fabricated with state-of-the-art technology which allows feature sizes of less than one micron. Besides the larger physical memory size necessary for such memories, the selection of a row of the memory array results in the activation of a larger number of memory cells. Such activation is generally performed by a row decoder presenting an active logic level on a long conductor commonly referred to as a row line, or word line. The active level on this conductor connects the memory cells in its associated row to their respective bit lines, in effect placing the storage cells in communication with sense amplifiers.

The number of memory cells activated for each row, of course, depends upon the storage capacity of the memory and the organization of the memory array. For example, in a "square" 1 Mbit memory array having 1024 columns by 1024 rows, the selection of an entire row activates 1024 memory cells, and connects this number of memory cells to bit lines for the communication of their stored data to a sense amplifier. Accordingly, the power consumption required for the selection and energizing of an entire row of memory cells becomes larger with such higher density memories. In SRAM devices where a single row address may be presented for a relatively long period of time (e.g., for sequential operations to multiple numbers of memory cells in the same row), the active power consumed by the device is quite high. It is therefore desirable to limit the duration for which an entire row is activated.

The problem of high active power dissipation is especially acute in memories such as dual-port RAMs and FIFOs. In each of these memory types, selection and simultaneous enabling of two rows of memory cells is often performed in accomplishing simultaneous read and write operations. Accordingly, the active power for such memories, for such simultaneous operations, is double that of a similarly-sized single port RAM.

One prior technique for limiting the duration of row line selection is to "time-out" the energizing of the row line, so that after a row is initially accessed, the row line signal is returned to an inactive logic level. Storage of the contents of the memory cells in the row is provided by sense amplifiers in such an arrangement, so that repeated read operations may be performed without requiring that the row line be energized. This technique monitors transitions at the data input terminals, indicative of a write operation, in which case the row line signal is again energized to allow for the writing of data into the memory cells of the selected row. It has been observed that this technique is subject to error in the case where transitions at the data inputs are relatively slow, as such slow transitions may possibly be undetected by the transition detection circuit. In addition, the presence of tri-state conditions on the data bus to which the input terminals are connected may present an erroneous transition to the detection circuit.

Another prior technique for limiting power dissipation is the reduction of the active bit line loads served by a particular row line. For example, multiple row decoders may be provided for each "row", so that a combination of the row address and the most significant column address bits selects a row decoder, with the number of memory cells in each selected row reduced. While such a technique reduces the active power, the size of the integrated circuit chip must increase in order to implement additional row decoders. This not only increases the cost of manufacture of the circuit, but also may present problems in fitting the circuit into the desired package size.

Another prior technique for selecting a portion of a row line is described in Sakurai, et al., "A Low Power 46 ns 256 kbit CMOS Static RAM with Dynamic Double Word Line", *IEEE J. Solid State Circuits*, Vol. SC-19, No. 5 (IEEE, Oct. 1984), pp. 578-585. The technique described in this article uses two word lines in accessing each bit, one being a main word line MWL and the other being smaller section word lines SWLs. As shown in FIG. 2 of the Sakurai et al. article, the main word line is presented by the row decoder, with NOR gates controlled by the column decoder for driving the section word lines; the NOR gates for each section are connected in parallel relative to each other, all off of the main word line. In this way, only the portion of the row in the selected section is accessed. However, this scheme requires an additional level of conductor, namely a second aluminum layer (see page 579, right hand column, and Table II). Such additional process complexity is, of course, quite costly. In addition, the main word line from the row decoder must remain energized for the full duration of the time that the selected section word line is to remain active.

It is therefore an object of this invention to provide a memory architecture which provides for reduced power dissipation by limiting the number of memory cells selected after a row line has been energized.

It is a further object of this invention to provide such a memory architecture which includes control circuitry which prevents the powering-on of multiple row lines during power-up of the memory device.

Other objects and advantages of the invention will be apparent to those of ordinary skill in the art having reference to the following specification together with the drawings.

SUMMARY OF THE INVENTION

The invention may be incorporated into an integrated memory circuit having one or more arrays of memory cells arranged in rows and columns. After selection of a row of memory cells according to a row address, certain ones of the column address bits select the portion of the row to be interrogated, and the row line for the unselected portions of the row is de-energized. A latching repeater is used to maintain the portion of the row line energized, so that the row line on either side of the selected portion can be disabled. The latched repeater is constructed in such a manner that only a single signal (or a signal and its complement) is required to isolate the repeaters after selection of the row lines, and to discharge repeaters associated with unselected sub-arrays.

DETAILED DESCRIPTION OF THE PREFERRED EMBODIMENTS

Figure 1:
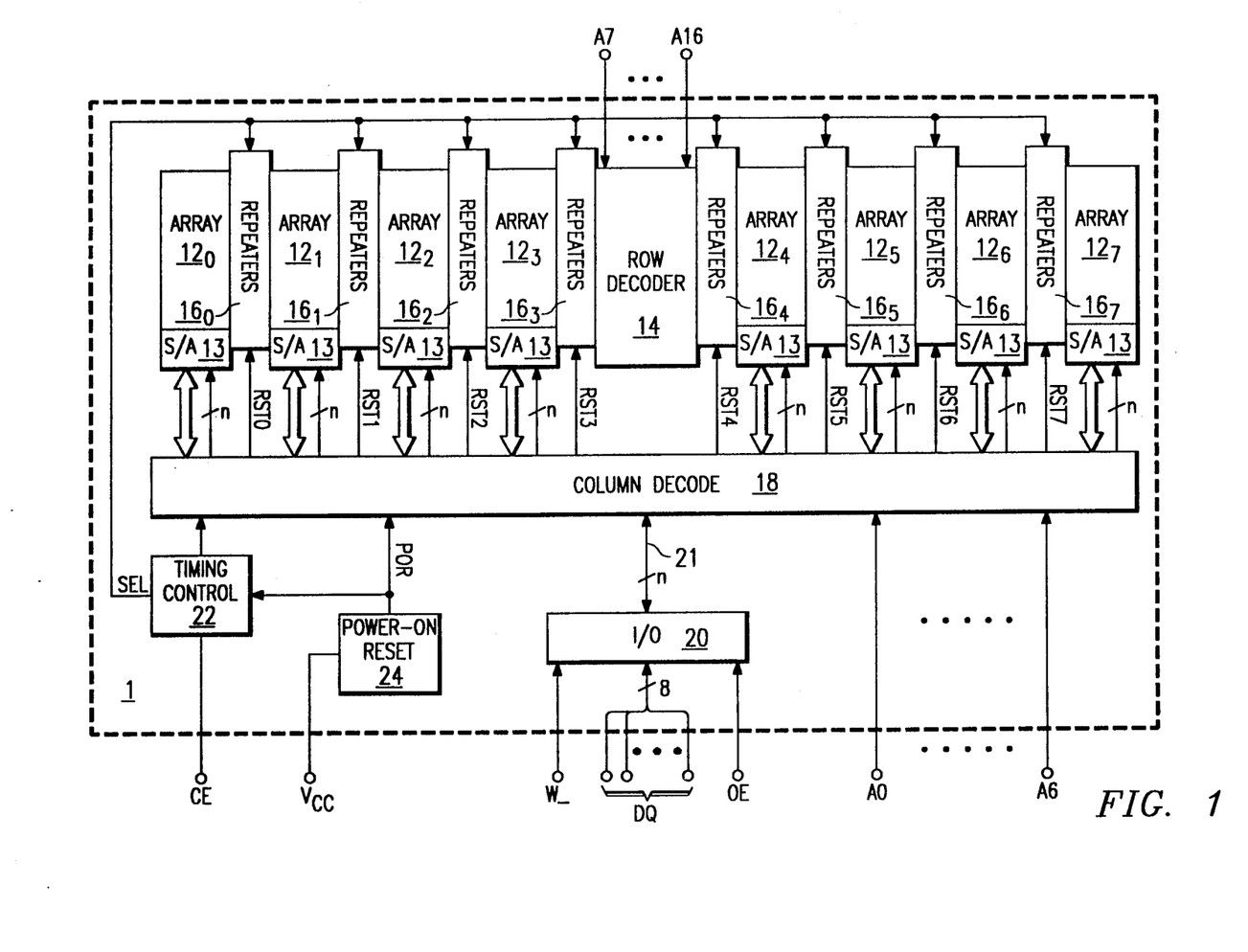
FIG. 1 is an electrical diagram, in block form, of a memory constructed according to a preferred embodiment of the invention.

Referring now to FIG. 1, a block diagram of an integrated circuit memory 1 incorporating the preferred embodiment of the invention described herein will be discussed. Memory 1 is an integrated circuit memory, for example a static random access memory (SRAM), having $2^{20}$, or 1,048,576, storage locations or bits. Memory 1 in this example is a wide-word memory, organized as $2^{17}$, or 128k, addressable locations of eight bits each. Accordingly, for example in a read operation, upon the access of one of the memory locations, eight data bits will appear at the eight input/output terminals DQ. The electrical organization of memory 1, in this example, is 1024 rows of 1024 columns, with eight columns accessed in each normal memory operation.

In this example of memory 1, the memory array is divided into eight sub-arrays $12_0$ through $12_7$, each of which have 1024 rows and 128 columns. Memory 1 includes seventeen address terminals A0 through A16, for receiving the seventeen address bits required to specify a unique memory address. In the conventional manner, the signals from these seventeen address terminals are buffered by address buffers (not shown). After such buffering, signals corresponding to ten of the address terminals (A7 through A16) are received by row decoder 14, for selecting the one of the 1024 rows to be energized by row decoder 14.

FIG. 1 illustrates schematically the relative physical location of sub-arrays 12 relative to one another, and relative to row decoder 14. As will be described in further detail hereinbelow, the selection of a row of memory cells in sub-arrays 12 is accomplished by row lines, one of which is driven from row decoder 14 according to the value of the row address at terminals A7 through A16. In an arrangement such as shown in FIG. 1 where row decoder 14 is located centrally, with sub-arrays 12 on either side thereof, it is preferred that the most significant column address bit (address terminal A6 in this embodiment) also be decoded by row decoder 14, so that the row line may be energized only on one side of the centrally located row decoder 14, according to this most significant column address bit. The energizing of a row line connects the contents of memory cells to their corresponding bit lines in the conventional manner. Sense amplifiers 13 are provided for sensing and storing the data state on the bit lines in sub-arrays 12. It should be noted that many conventional arrangements and organization of sense amplifiers 13 may be utilized in memory 1 according to the invention, such arrangements including the assignment of one sense amplifier for each bit line pair, or the assignment of one sense amplifier for multiple bit line pairs, with the selection of which bit line pair is to be sensed made by column decoder 18 according to the column address.

For purposes of reducing the power consumed during active operation, in this embodiment only one of the sub-arrays 12 remains energized during each active cycle, with the selection of the sub-array 12 which remains energized determined by the desired memory address (i.e., three bits of the column address). This is done by repeaters 16, which are provided between sub-arrays 12, and also between row decoder 14 and sub-arrays $12_3$ and $12_4$. Repeaters 14 pass along the energized state of the selected row line and, as will be described in further detail hereinbelow, latch the energized state of the selected row line for the selected sub-array 12, and de-energize the row line for sub-arrays 12 which are not selected. This arrangement requires that all eight bits of the accessed memory location are to be located in the same sub-array 12.

Signals corresponding to the remaining seven address terminals (A0 through A6) are received by column decoder 18 to control repeaters 14 to maintain selection of one of sub-arrays 12 by way of lines RST0 through RST7. Column decoder 18 also selects the desired columns in the selected sub-array 12 responsive to the remainder of the column address value, in the conventional manner. While single lines are indicated for the communication of the address value to row decoder 14 and column decoder 18, it should be noted that, as in many conventional memories, both true and complement values of each address bit may alternatively be communicated from the address buffers to the decoders, for ease of decoding.

Further included in memory 1 according to this embodiment of the invention, is input/output circuitry 20, which is in communication with column decoder 18 via an n-bit bus 21, with input/output terminals DQ, with write enable terminal W_, and with output enable terminal OE. Input/output circuitry 20 includes conventional circuitry for providing and controlling communication between input/output terminals DQ and the memory cells selected according to the address value presented to memory 1, and accordingly will not be described in further detail herein. It should be noted that many other alternative organizations of memory 1, relative to the input/output width, and including dedicated rather than common input/output terminals, may also utilize the present invention.

Memory 1 further includes timing control circuitry 22, which controls the operation of various portions of memory 1 during a memory cycle in the conventional manner. It should be noted that timing control circuitry 22 is generally not a particular block of circuitry, as suggested by FIG. 1, but generally is distributed within memory 1 to control the operation of various portions therein. Timing control circuitry 22 receives, for example, signals from terminal CE which enables and disables the operation of memory It should also be noted that, for some static memories, timing control circuitry 22 may also respond according to a conventional address transition detection circuit (not shown), to control the operation of memory 1 dynamically. It should be noted that such control according to address transition detection is preferred in this embodiment of the invention, as control of repeaters 16 is preferably performed dynamically within a cycle, as will be described further hereinbelow. As shown in FIG. 1. line SEL from timing control circuitry 22 is connected to repeaters 16, for control thereof as will be described hereinbelow.

Memory 1 further includes a power-on reset circuit 24. Power-on reset circuit 24 receives bias voltage from power supply terminal $V_{cc}$ (as of course do other portions of memory 1 by connections not shown), and generates a signal on line POR indicating that the $V_{cc}$ power supply has reached a sufficient level upon memory 1 initially powering up, to prevent portions of memory 1 from powering-up in an indeterminate, or undesired, state. As will be described hereinbelow, and as described in copending application Ser. No. 569,000, filed Aug. 17, 1990, incorporated herein by this reference, said application assigned to SGS-Thomson Microelectronics, Inc., power-on reset circuit 24 may similarly also control other portions of memory 1, as suggested by the connection of line POR to timing control circuitry 22 in FIG. 1. Said copending application Ser. No. 569,000 also describes preferred configurations of power-on reset circuit 24, although for purposes of this invention conventional power-on reset circuits may also be used.

Figures 10, 10A, 10B:
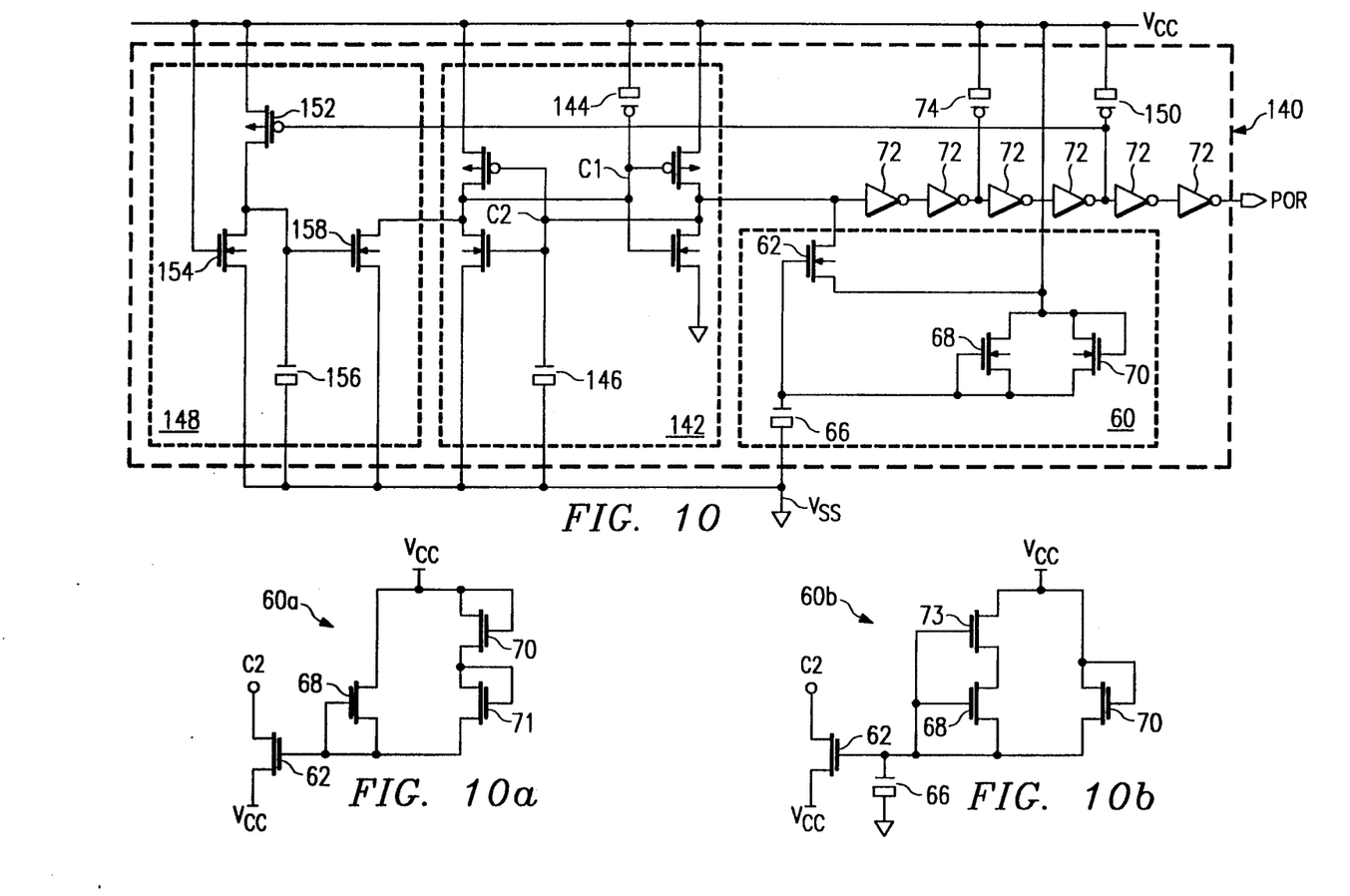
FIG. 10 is an electrical diagram, in schematic form, of a first embodiment of a power-on reset circuit, including a reset circuit therewithin.
FIGS. 10a and 10b are electrical diagrams, in schematic form, of alternate embodiments of reset circuits for the power-on reset circuit of FIG. 10.

Referring now to FIG. 10, the preferred construction and operation of power-on reset circuit 140 according to this embodiment of the invention will now be described. Power-on reset circuit 140 receives the power supply voltage $V_{cc}$ and the ground reference voltage $V_{ss}$. $V_{cc}$ and $V_{ss}$ bias the transistors of CMOS latch 142. Latch 142 is a conventional latch constructed of cross-coupled CMOS inverters, and also includes capacitor 144 connected between $V_{cc}$ and cross-coupled node C1 therein, and capacitor 146 which is connected between $V_{ss}$ and the other cross-coupled node C2 therein. As will be described in further detail hereinbelow, capacitors 144 and 145 preset latch 142 upon power-up of memory 1.

Latch 142 communicates its logic state to line POR, via a string of inverters 72 connected to cross-coupled node C2. The number of inverters 72 in this string (in this embodiment six), determines the delay time between the switching of latch 142 and the transition of line POR. Within the string of inverters 72, one plate of capacitor 150 is connected to the input of an inverter 72 which is an odd number of inverters from node C2 (in this case, at the input of the fifth inverter 72 from node C2), with the other plate connected to $V_{cc}$. Also within the string of inverters 72, capacitor 74 is connected on one side to the input of one of inverters 72, preferably an inverter 72 which is an odd number of inverters from node C2 (in this case, capacitor 74 is connected to the input of the third inverter 72 from node C2) and has its other plate connected to $V_{cc}$. Capacitor 74 serves to stabilize the operation of power-on reset circuit 140 so that it does not rapidly oscillate in the event of $V_{cc}$ making small excursions about the trip point of the circuit; capacitor 74 also slows the operation of the chain of inverters 72, as will be discussed in more detail hereinbelow.

Power-on reset circuit 140 further includes timed switch 148 biased between $V_{cc}$ and $V_{ss}$. $V_{cc}$ is connected to the source of a p-channel transistor 152 which has its gate connected to the plate of capacitor 150 which is connected within the chain of inverters 72. The drain of transistor 152 is connected to the drain of an n-channel transistor 154, which has its gate tied to $V_{cc}$ and its source biased by $V_{ss}$. Transistor 152 is preferably larger than transistor 154, with the W/L on the order of 10 and 4, respectively. The drawings of transistors 152 and 154 are connected to one plate of a capacitor 156, which has its opposing plate tied to $V_{ss}$, and to the gate of transistor 158, which has its drain connected to cross-coupled node C1 of latch 142, and which has its source at $V_{ss}$. As will be apparent in the description of the operation hereinbelow, timed switch 148 causes latch 142 to change its state at a period of time after the powering up of $V_{cc}$.

It should be noted that the provision of latch 142, timed switch 148, and the delay chain of inverters 72, are conventional in power-on reset circuits. Such conventional power-on reset circuits, not including a reset circuit such as reset circuit 60 shown in FIG. 10, are subject to inaccurate operation in the event of brief power losses if the state of the power-on circuit is not quickly reset in the event of a power loss. If the power supply is lost and then restored before the power-on reset circuit has had time to return to its proper initial state, the power-on reset circuit will be immediately issuing the signal to the remainder of the circuit (i.e., the same signal as it was issuing at the time of power loss) that power-one has fully occurred, and enable normal operation of the circuit, before full power-up occurs. This allows the remainder of the circuit to initialize in a random, and therefore potentially undesirable, state.

According to this embodiment of the invention, however, power-on reset circuit 140 further includes reset circuit 60, which ensures that the state of power-on reset circuit 140 is fully and quickly reset upon power supply $V_{cc}$ falling below a certain level. Reset circuit 60 includes n-channel transistor 62, which has its sourceto-drain path connected between cross-coupled node C2 of latch 142 and $V_{cc}$, and has its gate coupled to one plate of capacitor 66, which has its other plate connected to $V_{ss}$. The gate of transistor 62 is further connected to the sources of transistors 68 and 70. N-channel transistors 68 and 70 each have their drains connected to $V_{cc}$; the gate of transistor 68 is connected to $V_{cc}$. As will be discussed hereinbelow relative to the operation of reset circuit 60, it is preferable that transistor 62 be constructed so that it has a threshold voltage which is lower than that of transistor 68. As is well known in the art, this can be done by way of different threshold adjust ion implantation for transistors 62 and 68, or alternatively by making the W/L ratio of transistor 62 significantly greater than that of transistor 68.

The operation of power-on reset circuit 140, including reset circuit 60, will now be described beginning from a state in which no power is applied to $V_{cc}$, and as memory 1 is powered up. As $V_{cc}$ ramps up from an unpowered condition, capacitors 144 and 146 will cause latch 148 to set in a state where node C1 is at a high level and node C2 is at a low level, due to the action of capacitors 144 and 146 respectively connected thereto. A low logic level at cross-coupled node C2 will present, via the six inverters 72, a low logic level at line POR. This indicates to the remainder of memory 1, and specifically to evaluation logic 30, that memory 1 is not yet sufficiently powered up. In this initial state, transistor 62 in reset circuit 60 remains off, as its gate (at capacitor 66) has not yet charged up through transistor 70.

As power-up begins, the gate of transistor 152 in timed switch 148, connected to the plate of capacitor 150 which is also connected to the input of a odd inverter 72 following node C2, is at a low logic level since node C2 is low. Transistor 152 is thus turned on as $V_{cc}$ rises above a certain level during power up; while transistor 154 is also turned on, due to transistor 152 being much larger than transistor 154 the node at the drains of transistors 152 and 154 is pulled toward $V_{cc}$. After power supply $V_{cc}$ reaches a certain level at it powers up, for example 3.3 volts, and since the gate of transistor 158 follows the drain of transistor 152, transistor 158 also turns on, pulling node C1 low toward $V_{ss}$. This will pull cross-coupled node C1 to a low logic level, and switches transistor 142 so that a high logic level is presented at node C2. After the time necessary to ripply through chain of inverters 72, including charging up capacitor 150 at the input of the fifth inverter 7s in the chain, line POR goes to a high logic level, and indicates to the remainder of memory 1, including evaluation logic 30, that power-up has occurred. An example of a preferred delay time between the point in time at which $V_{cc}$ reaches the trip level and the issuing of a high logic level on line POR is on the order of ten nanoseconds.

Once the high logic level at node C2 has rippled through the chain of inverters 72, capacitor 150 is charged in such a state that the gate of transistor 152 is at a high voltage, which turns off p-channel transistor 152. At this time, due to the operation of transistor 154 with its gate at $V_{cc}$, the gate of transistor 158 is pulled low, turning off transistor 158. This allows node C1 to be held at a low logic level by the operation of latch 142, but with no external driving voltage applied thereto. As a result, reset circuit 60 can easily reset latch 142 to its prior state, in the event of a loss of voltage at power supply $V_{cc}$.

Also after power-up, due to the operation of n-channel transistor 70, the gate of transistor 62 is at a voltage approximately $V_{cc} - V_{t70}$ ($V_{t70}$ being the threshold voltage of transistor 70), which turns transistor 62 on. This connects node C2 to $V_{cc}$ through transistor 62, which further assists the holding of node C2 high and, by operation of latch 142, assists the holding of node C1 low. Accordingly, latch 142 remains in this state for so long as $V_{cc}$ remains powered up, with the powered up state indicated by a high logic level on line POR.

In the event that the voltage of power supply $V_{cc}$ falls to a certain level below its nominal operating level, however, power-on reset circuit 140 will be reset by reset circuit 60. As $V_{cc}$ falls toward zero volts, the gate of transistor 62 will follow $V_{cc}$ while remaining at approximately $V_{t68}$ above the voltage of $V_{cc}$. This voltage remains at the gate of transistor 62 upon power supply $V_{cc}$ reaching zero volts, due to capacitor 66 being previously charged to $V_{cc} - V_{t70}$, and due to transistor 68 acting as a forward-biased diode. Since the threshold voltage of transistor 62 is lower than that of transistor 68, as described above, transistor 62 is on as power supply $V_{cc}$ reaches zero volts. This discharges cross-coupled node C2 of latch 142 to $V_{cc}$, which is at a low logic level (zero volts).

It should be noted that the use of an n-channel transistor 70, rather than a p-channel transistor, will be important for most CMOS implementations of the circuit of FIG. 10. As is conventional in CMOS, the n-well regions into which p-channel transistors are formed are generally biased to $V_{cc}$, to ensure that the source-to-well junctions of the p-channel transistors are not forward biased. If such a p-channel transistor were used in place of transistor 70 (of course with its gate connected to the gate of transistor 62 to implement the same function, the gate of transistor 62 would be clamped to the forward biased p-n junction voltage drop (on the order of 0.7 volts), rather than to $V_{t68}$, upon power supply $V_{cc}$ falling to ground. If the threshold voltage of transistor 62 is higher than this drop, transistor 62 would not be conductive, and reset circuit 60 would not be operable to quickly discharge node C2 in latch 142. It is therefore preferable to use n-channel transistor 70, which will preset a reverse-biased diode to the gate of transistor 62 as $V_{cc}$ falls, allowing the gate of transistor 62 to fall to the voltage of $V_{t68}$.

This discharging of node C2 to ground as $V_{cc}$ falls ensures that power-on reset circuit 140 will properly operate even if the loss of voltage on $V_{cc}$ is short. Proper operation of power-on reset circuit 140 in the generation of a low logic level on line POR for a certain length of time upon power-up, i.e., until $V_{cc}$ has been above a certain level for a certain time at which time line POR returns high. Such operation requires that, for the circuit for FIG. 10, latch 142 must, on power-up, set to a state with node C1 high and node C2 low, with timed switch 148 causing the switching of latch 142 and the generation of the high logic signal on line POR thereafter. In the event of a brief loss of power, after which the proper power-on reset procedure is desired, reset circuit 60 ensures the resetting of latch 142 by discharging node C2 (and capacitor 146) through transistor 62. Without this discharge path provided by reset circuit 60, capacitor 146 may not be sufficiently discharged by way of leakage so that it would set node C2 low again upon power-up after a brief loss of voltage at power supply $V_{cc}$.

It should further be noted that capacitor 66 also slows the rate at which transistor 62 turns on as power-up begins. This ensures that it is the operation of timed switch 148 which causes latch 142 to change state on power-up, rather than the premature charging of node C2 through transistor 62. Accordingly, by way of capacitor 66, reset circuit 60 does not disturb the operation of power-on reset circuit 140 during the power-up sequence.

Referring now to FIGS. 10a and 10b, the construction and operation of alternative reset circuits 60a and 60b which may be included in power-on reset circuit 140 in place of reset circuit 60 will now be described in detail. FIG. 10a shows a first alternative reset circuit 60a which includes transistor 62, having its source-to-drain path connected between cross-coupled node C2 of latch 142 and $V_{cc}$, and having its gate connected to the source of transistor 68, as in reset circuit 60 of FIG. 10. Unlike reset circuit 60 of FIG. 10, reset circuit 60a does not include capacitor 66 connected between the gate of transistor 62 and $V_{ss}$. Transistor 68, as in the case of FIG. 10, is configured in diode fashion, with its source-to-drain path connected between $V_{cc}$ and the gate of transistor 62, and with its gate connected to the gate of transistor 62. N-channel transistors 70 and 71 are configured in diode fashion and connected in series between $V_{cc}$ and the gate of transistor 62, oriented in a direction so that they are forward biased with $V_{cc}$ positive relative to the gate of transistor 62.

Reset circuit 60a of FIG. 10a, due to series transistors 70 and 71 between $V_{cc}$ and the gate of transistor 62, delays and clamps the charging of the gate of transistor 62 during the powering up of power supply $V_{cc}$, so that transistor 62 does not turn until after latch 142 (shown in FIG. 10) has switched. Additional transistors may be included in series with transistors 70 and 71, to further delay the turning on of transistor 62 as desired. However, in order for transistor 62 to be capable of discharging node C2 as power supply $V_{cc}$ falls, the number of transistors in series between $V_{cc}$ and the gate of transistors 62 cannot be so large that the voltage at the gate of transistor 62 is clamped at a voltage lower than its threshold voltage. If this is the case, transistor 62 will not turn on during power-up, not will it be on during power-down, precluding the operation of reset circuit 60. It should be noted that a capacitor may be connected to the gate of transistor 62, in similar manner as capacitor 66 in FIG. 10, in combination with multiple transistors 70, 71 in the series connection of FIG. 10a, to further assist the delay in the charging of the gate of transistor 62 during power-up without affecting its clamped voltage.

Referring now to FIG. 10b, a reset circuit 60b according to another embodiment of the invention is illustrated, for use in power-on reset circuit 140 of FIG. 10, in substitution for reset circuit 60. Reset circuit 60b is constructed similarly as reset circuit 60 of FIG. 10, with the source-to-drain path of transistor 62 connected between cross-coupled node C2 of latch 142 and $V_{cc}$. The gate of transistor 62 is connected to n-channel transistor 70, and is also connected to a plate of capacitor 66. Transistor 70, as in FIG. 10, is connected in diode configuration between $V_{cc}$ and the gate of transistor 62, with its gate connected to $V_{cc}$. Reset circuit 60b also includes n-channel transistors 68 and 73, which have their source-to-drain paths connected in series between $V_{cc}$ and the gate of transistor 62, and which each have their gates connected to the gate of transistor 62. It should be noted that transistors 68 and 73 may be fabricated in such a way that their threshold voltages are the same as that of transistor 62.

As discussed above relative to FIG. 10, for reset circuits 60 (and 60a and 60b) to properly operate, transistor 62 must be on at such time as power supply $V_{cc}$ is powered down, even to zero volts. In reset circuit 60, this is accomplished by fabricating transistors 62 and 68 in such a manner that their threshold voltages differ, with the threshold voltage of transistor 62 below that of transistor 68. However, such a fabrication requirement may not be compatible with the fabrication process used to make memory 1. In addition, many variables in the fabrication process of integrated circuits are known to have significant effects on threshold voltages. The alternative reset circuit 60b presents a circuit which has potentially reduced process sensitivity than reset circuit 60, due to the use of series transistors 68 and 73.

In power-up, reset circuit 60b operates similarly to reset circuit 60 of FIG. 10. When power supply $V_{cc}$ is powered down, however, the voltage to which the gate of transistor 62 will fall will be held by transistors 68 and 73 is $V_{cc}+V_{t68}+V_{ds73}$, where $V_{ds73}$ is the series voltage drop of the source-to-drain path of transistor 73. Accordingly, once transistor 70 is reverse-biased in power-down, with the threshold voltage of transistor 62 and 68 equal (i.e., $V_{t62}=V_{t68}$) the voltage at the gate of transistor 62 will be higher than $V_{cc}$ (i.e., the source of transistor 62) by more than its threshold voltage. Transistor 62 will thus serve to discharge node C2 to the powered-down $V_{cc}$, resetting latch 142.

The connection of the gate of transistor 73 to the gate of transistor 72, rather than in diode configuration, is preferable in reset circuit 60b for purposes of controlling the voltage at the gate of transistor 62 when power supply $V_{cc}$ is powered up. The voltage $V_{ds73}$ is smaller in magnitude than the threshold voltage of transistor 73, and accordingly the voltage at the gate of transistor 62 is not higher than necessary to discharge cross-coupled node C2. This is beneficial because the voltage of power supply $V_{cc}$, as it powers up, will capacitively coupled to the gate of transistor 62 via transistors 68, 70 and 73, and be additive with whatever voltage is present at the gate of transistor 62 at that time. As noted above, it is desirable that transistor 62 not be turned on prior to the operation of timed switch 148, as this would cause latch 142 to switch prior to full power-up of $V_{cc}$. The likelihood of such premature conduction through transistor 62 increases with higher voltages at its gate at the time of power-up of power supply $V_{cc}$. Reset circuit 60b thus keeps the voltage at the gate of transistor 62 high enough for conduction during power-down, but not excessively high, reducing the likelihood of this undesired conduction.

In the alternative reset circuit 60b, the reduced process sensitivity is obtained from the reduced dependence of the operation of the circuit on a differential threshold voltage. Indeed, transistors 62 and 68 can be fabricated to be of the identical size, and substantially at the same location in the integrated circuit, so that variations in process will tend to affect transistors 62 and 68 identically. Due to the inclusion of series transistor 73, transistor 62 will still remain on in the power-down condition sufficiently long for the latch to be reset.

Of course, relative to reset circuit 60 of FIG. 10, the alternative embodiment of reset circuits 60a and 60b of FIGS. 10a and 10b require one or more additional transistors. It is contemplated that one of ordinary skill in the art will now be able to select from one of these alternatives, or from other alternatives which will now be apparent, according to the fabrication process variations, circuit requirements, and other such factors of the particular circuit and under design.

As noted above, for purposes of reducing power consumption, memory 1 according to this embodiment energizes only one of the eight sub-arrays 12, selected according to the three most significant column address bits. In this embodiment, repeaters 16 are present between sub-arrays 12, and also between row decoder 14 and each of sub-arrays $12_3$ and $12_4$, for maintaining the application of the energized row line within the selected sub-array 12 and, after a period of time, de-energizing the row line in the other sub-arrays 12. In this way, the column address (particularly the three most significant bits) controls the application of the word line so that only that portion of the word line in the selected sub-array 12 is energized for the entire memory operation cycle. Column decoder 18 also selects eight of the 128 columns in the selected sub-array 12, according to the value of the remaining bits of the column address. In this embodiment, also for purposes of reducing active power consumption, only those sense amplifiers 13 in the selected sub-array 12 which are associated with the desired memory bits are energized. Sense amplifiers 13 so selected by column decoder 18 are then placed in communication with input/output circuitry 20 via bus 21, through which the reading of data from or writing of data to the selected memory cells may be done in the conventional manner.

Of course, many alternative organizations of memory 1 may be used in conjunction with the invention described herein. Examples of such organizations would include by-one memories, where a single bit is input to or output from in normal operation. In addition, wide-word memories where each sub-array is associated with one of the input/output terminals, and memories where the entire array is energized during normal operation, may alternatively be used. As mentioned hereinabove, of course, other memory types such as dynamic RAMs, EPROMs, embedded memories, dual-port RAMs, FIFOs, and the like, each with organization of their own, may also benefit from this invention.

It should also be noted that other physical and electrical arrangements of the sub-arrays 12 may be alternatively be used with the present invention. For example, two row decoders 14 may be incorporated into memory 1, each of which controls the application of a row line signal into half of the memory. Row decoder or decoders 14 may also be located along one edge of its associated sub-arrays 12, rather than in the middle thereof as shown in FIG. 1. It is contemplated that the particular layout of memory 1 will be determined by one of ordinary skill in the art according to the particular parameters of interest for the specific memory design and manufacturing processes.

Figure 2:
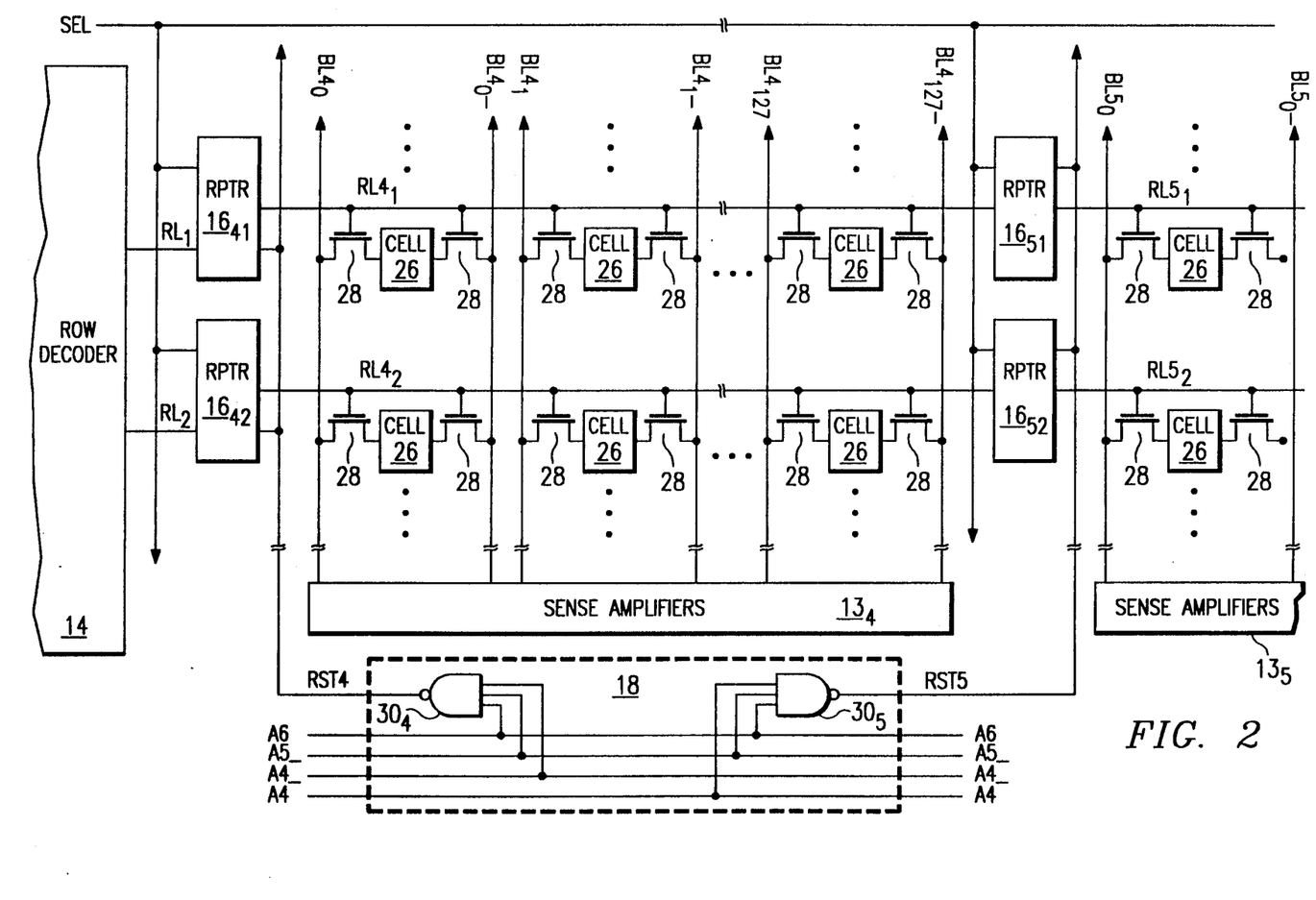
FIG. 2 is an electrical diagram, in schematic form, of a row line in the memory of FIG. 1 together with its latched repeaters.

Referring now to FIG. 2, the implementation of repeaters 16 in memory 1 will be described in further detail, relative to two rows of memory cells 26 in sub-arrays $12_4$ and $12_5$. In this embodiment, memory cells 26 are static RAM cells, consisting of cross-coupled inverters having polysilicon resistor pull-ups, with each memory cell 26 associated with a row line RL and a pair of bit lines BL and BL_ by way of a pair of pass transistors 28. It should be noted that, memory cells 26 may alternatively be dynamic RAM cells of the one-transistor one-capacitor type, FAMOS EPROM cells, or such other storage cells used in the art.

FIG. 2 shows row lines $RL4_1$ and $RL4_2$, each of which is connected to the gates of n-channel pass transistors 28 so that, with a high level on the selected row line RL4, the pass transistors 28 having their gates connected to the selected row line RL4 will connect their memory cells 26 to bit line pairs BL4 and BL4_. In sub-array $12_4$, in this example, there are 128 columns, and accordingly pairs of bit lines $BL4_0$, $BL4_0$_ through $BL4_{127}$, $BL4_{127}$_. Sub-array $12_5$ is similarly arranged.

As noted hereinabove, repeaters 16 each receive a signal on line SEL from timing control circuitry 22 in FIG. 1. In addition, each of repeaters $16_{41}$ and $16_{42}$ (as well as all repeaters $16_4$), receive line RST4 from column decoder 18, and each of repeaters $16_{51}$ and $16_{52}$ receive line RST5 from column decoder 18. Similar lines RST from column decoder 18 similarly control others of repeaters 16 in memory 1.

Each of lines RST from column decoder 18 in this embodiment, are generated according to the three most significant bits A6, A5, A4 of the column address, these three bits having the function of selecting the desired sub-array 12. As shown in FIG. 2, column decoder 18 either includes or receives true and complement values of each address bit. For selecting sub-arrays $12_4$ and $12_5$, the values of column address bits A6, A5, A4 are 100 and 101, respectively. Accordingly, NAND gate $30_4$ receives lines A6, A5_ and A4_ at its three inputs, and drives line RST4 accordingly. Similarly, NAND gate $30_5$ receives lines A6, A5_, and A4 at its three inputs, for generating line RST5. Of course, only that portion of column decoder 18 useful for controlling repeaters 16 is shown in FIG. 2; the remainder of column decoder 18 for selecting the desired bits in the selected rows of sub-arrays 12 is constructed conventionally, according to the desired memory architecture.

Figure 3:
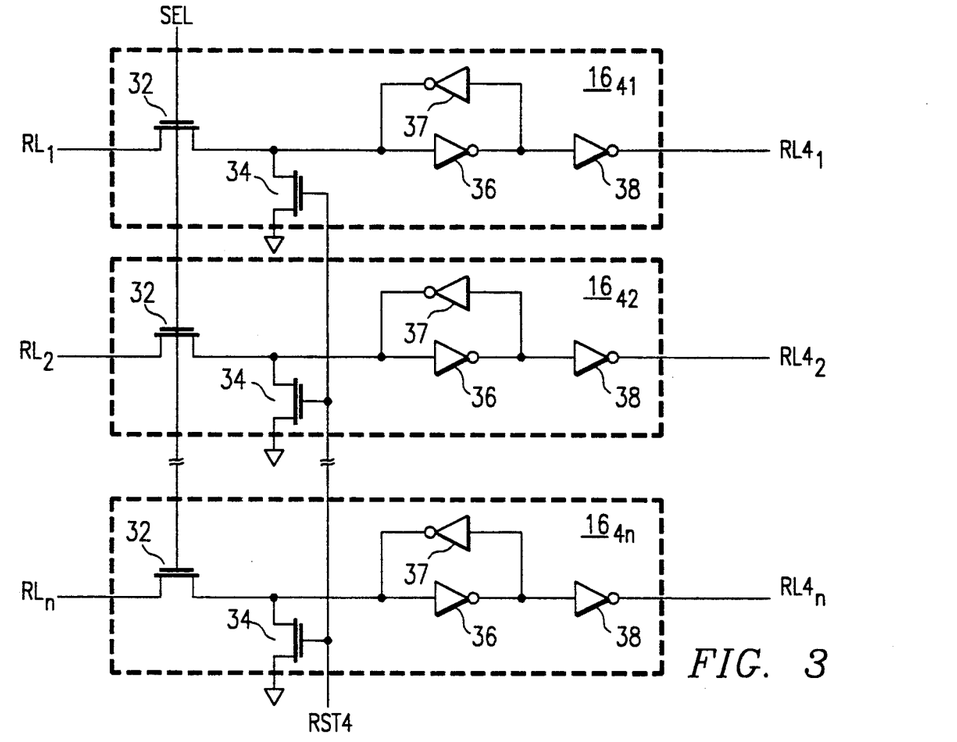
FIG. 3 is an electrical diagram, in schematic form, of a first embodiment of a latched repeater of FIG. 2.

Referring now to FIG. 3, the construction and operation of a first embodiment of repeaters 16 will now be described, relative to the example of repeaters $16_{41}$ through $16_{4n}$. Each of repeaters $16_4$ receive a row line RL associated with its row of sub-array $12_4$. In the case of repeaters $16_4$, which are adjacent to row decoder 14, row lines RL are driven directly from row decoder 14. For those repeaters which are not directly adjacent to row decoder 14, the input to each is the row line from the prior repeater 16. For example, the input to each of repeaters $16_5$ is the output of a corresponding repeater $16_4$, on row lines RL4.

The input row line RL is communicated, for each repeater 16, via n-channel pass gate 32 which has its gate connected to line SEL from timing control circuitry 22. Pass gate 32 is connected to the input of inverter 36, the output of which is connected, via buffering inverter 38, to the output row line RL4, in the example of FIG. 3. Inverter 37 has its input connected to the output of inverter 36 and has its output connected to the input of inverter 36, so that a latch is formed by inverters 36 and 37. Inverters 36, 37, and 38 are conventional inverters, such as CMOS inverters. Each repeater 16 also includes n-channel transistor 34, which has its source-to-drain path connected between the input of inverter 36 and ground, and which has its gate controlled by line RST4, in the case of repeaters $16_4$. In this embodiment, inverter 37 preferably has weak drive capability relative to transistor 34, in order that transistor 34 can reset the state of the latch of inverters 36 and 37. In addition, inverter 37 is also preferably weak relative to pass transistor 32, so that the state of the latch may also be rewritten upon the energizing of a row line by row decoder 14. This weak drive may be implemented by using transistors in inverter 37 which have small width-to-length ratios (W/L) relative to that of transistor 34.

Similarly, according to this embodiment, repeaters 16 associated with other sub-arrays 12 will have the gates of their transistors 36 controlled by the appropriate line RST from column decoder 18, as shown in FIG. 1. In addition, all of repeaters 16 in this embodiment include pass gates 32 controlled by line SEL from timing control circuitry 22.

Referring to the timing diagram of FIG. 4, together with FIGS. 1, 2 and 3, the operation of memory 1 including this embodiment of repeaters 16 will now be described, for the example where row 1 in sub-array $12_5$ is selected. At time $t_0$, the address terminals A0 through A16 make a transition to the desired memory address, which in this case is row 1 in sub-array $12_5$; the least significant bits of the column address, i.e., from terminals A0 through A3, are not shown in FIG. 4 as they are don't cares for purposes of the operation of repeaters 16. Responsive to the address transition, timing control circuitry 22 issues a high logic level on line SEL at time $t_1$, so that pass gates 32 in all of repeaters 16 are conductive at this point in the cycle, allowing for row decoder 14 to drive the selected row line (in this case, row line RL1) therethrough. Also responsive to the beginning of the cycle, all of lines RST preferably go to a high logic level, turning on each of transistors 34 in repeaters 16, which resets all row lines RL to low logic levels prior to the decoding of the row address by row decoder 14. This ensures that only one row line RL is enabled in the new cycle, by ensuring that the row line RL which was enabled in the prior cycle is discharged low.

Also at or about time $t_1$, preferably prior to or coincident with line SEL going to a high logic level, column decoder 18 presents low logic levels on all lines RST, so that transistors 34 are turned off for all of repeaters 16. This is preferred in order to reduce the row line load for row decoder 14 and inverters 38, so that power dissipation is reduced in the selection of a row and so that the speed of energizing the selected row line RL is not compromised. This may be done by timing control circuitry 22 precharging high all of the address lines A6, A6_, A5, A5_, A4, and A4_ as presented to NAND gates 30. Alternatively, NAND gates 30 in column decoder 18 may also be controlled by timing signals from timing control circuitry 22, so that no transistors 34 are turned on prior to line SEL going to a low logic level. For example, each of lines RST may be generated by gating the output of its associated NAND gate 30 by the signal on line SEL.

Responsive to the value of the row address at terminals A7 through A16 selecting row 1, row decoder 14 issues a high logic level on line RL1 at time $t_2$, which appears on line $RL4_1$ at time $t_3$, and which appears on line RL5 at time $t_4$. This similarly ripples through each of repeaters 16, so that all memory cells 26 associated with row 1 are connected to their respective bit line pairs BL and BL_.

Figure 4:
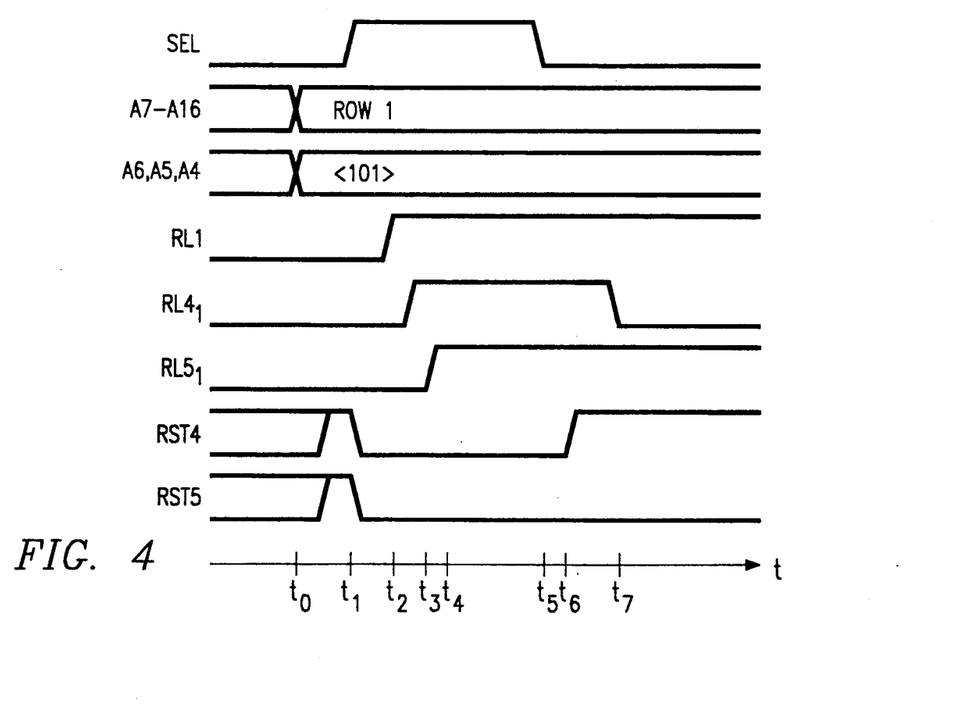
FIG. 4 is a timing diagram illustrating the operation of the latched repeater of FIG. 3 in the memory of FIGS. 1 and 2.

After a delay time sufficient to guarantee that all memory cells 26 in the selected row have been connected to their respective bit lines by the energizing of row line RL, turning on pass gates 28, line SEL is driven to a low logic level by timing control circuitry 22, occurring at time $t_5$ of FIG. 4. This isolates each of repeaters 16 from its input; for example, repeaters $16_4$ of FIG. 3 now are isolated from row lines RL from row decoder 14. For selected row 1, in this example, since the entire row line $RL_1$ has been energized through repeaters 16, a high logic level will be latched and maintained by the operation of inverters 36 and 37 for each of the repeaters 16 associated with row 1.

Responsive to the value of column address bits A6, A5, A4 selecting sub-array $12_5$ and at a point in time after line SEL has returned to a low level, NAND gate $30_4$ issues a high logic level on line RST4 at time $t_6$, with NAND gate $30_5$ maintaining a low logic level on line RST5. Of course, all other lines RST besides line $RST_5$ will, similarly as line RST4, be at a high logic level responsive to this value of the column address. This state on lines RST (other than line RST5) causes transistors 34 to connect the inputs of inverters 36 in each of repeaters 16 to ground. In the example of sub-array $12_4$, line RST4 is at a high logic level, and transistors 34 in FIG. 3 will be on, pulling the input of inverter 36 toward ground. Since transistor 34 is relatively large as compared to the pull-up device in latching inverter 37, the on condition of transistor 34 for row 1 in repeater 16 will cause the latch of inverters 36 and 37 to change state, presenting a low logic level on row line $RL4_1$ at time $t_6$. This causes pass gates 28 for memory cells 26 associated with row 1 in sub-array $12_4$ to turn off, reducing the power consumption of memory 1 resulting from the driving of bit lines BL and BL_ in this non-selected sub-array $12_4$. Of course, similar operation occurs for the other non-selected sub-arrays 12.

For selected sub-array $12_5$ in this example, however, the transistors 34 in repeaters $16_5$ are not turned on, since the output of NAND gate $30_5$ on line RST5 is at a low logic level. Row line $RL5_1$ is thus maintained at a high logic level by the operation of inverters 38 therein, with this state latched by the latch of inverters 36 and 37. The memory cells 26 associated with row 1 in sub-array $12_5$ thus remain selected, allowing multiple read and write operations to be performed thereto.

As described above, prior techniques for the reduction of active power included the timing-out of the selected row line signal RL, after a period of time in which no write activity occurred. While the above-described embodiment of the invention reduces power without such a time-out feature, and without the attendant problems therewith, it should be noted that the time-out feature may be used in combination with the present invention. After the row lines RL in the non-selected sub-arrays 12 are discharged, such a time-out feature may still be used in order to discharge the row line RL for the selected sub-array 12. This could be implemented by way of timing control circuitry 22 presenting a signal to NAND gate 30, for example, which causes line RST to go to a high level. Upon the detection of a transition at terminals DQ, terminal W_, or at the addresses, timing control circuit 22 could then effect the beginning of a new cycle.

Alternatively to the operation described above, transistors 34 in the decoding of NAND gates 30 may also be constructed to have a W/L which is small relative to the drive capability of row decoder 14 and pass transistor 32 in series therewith, and of buffering inverters 38. In this arrangement, NAND gates 30 may statically decode the address lines, and present their output on lines RST prior to line SEL returning low. Since transistors 34 are relatively small, as compared to the drive of row decoder 14 in series with pass transistor 32, and to the drive of buffering inverters 38, so long as line SEL is at a high logic level, transistors 34 are incapable of discharging the input of inverters 36 to ground.

Therefore, the decoding of the column address value can be done at this time, prior to line SEL isolating repeaters 16, and even prior to the energizing of the selected row line RL.

Figure 5A:
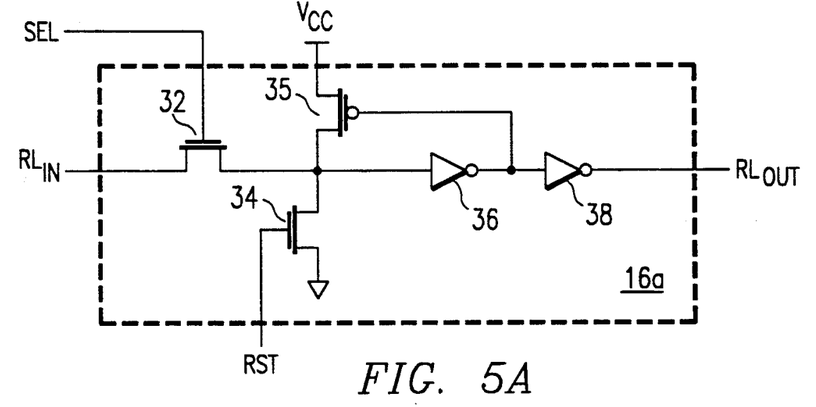
FIGS. 5a and 5b are electrical diagrams, in schematic form, of second and third alternative embodiments of the latched repeater of FIG. 2.

Referring now to FIG. 5a, repeater 16a according to an alternative embodiment of the invention will now be described. Repeater 16a, as in the case of repeater 16 described hereinabove, includes a pass gate 32 which receives the input row line signal (designated in FIG. 5a as row line $RL_{in}$) and communicates the same to the input of inverter 36; pass gate 32 has its gate controlled by line SEL from timing control circuitry 22. Also similarly as repeater 16 described hereinabove, repeater 16a of FIG. 5a includes a pull-down transistor 34 which is connected between the input of inverter 36 and ground, and which has its gate controlled by the appropriate line RST. Buffering inverter 38 has its input connected to the output of inverter 36 and presents the row line signal at its output, shown here as row line $RL_{out}$.

Repeater 16a according to this embodiment includes a simpler latching arrangement, in this case a p-channel transistor 35 which has its source-to-drain path connected between the input of inverter 36 and $V_{cc}$, and which has its gate connected to the output of inverter 36. Accordingly, the inverter 37 is reduced to a single p-channel transistor 35, which is preferably smaller than transistor 34 as described hereinabove, so that transistor 34 can pull down the input of inverter 36 when line RST is high. This is due to the recognition that the state of inverter 36 need only be latched in the event when a high logic level is to be presented on line $RL_{out}$, i.e., when the sub-array 12 associated therewith is selected. No latching is required in repeaters 16 when the associated sub-array 12 is not selected, as transistors 34 discharge the input to inverters 36 in those cases.

Figure 5B:
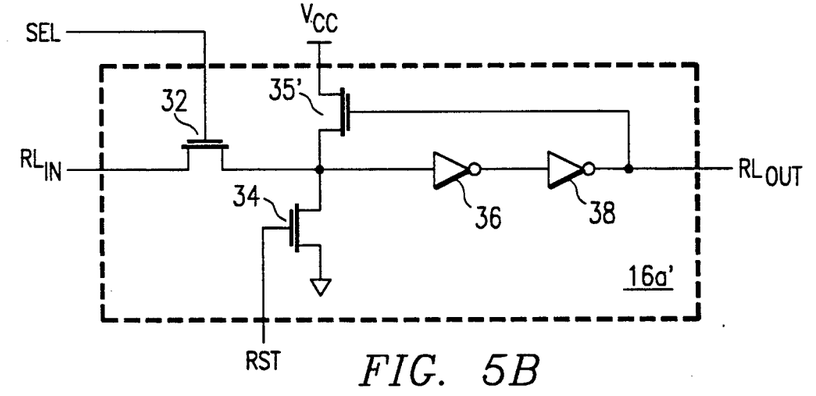

Referring to FIG. 5b, repeater 16a' according to an alternative arrangement will now be described. In repeater 16a', an n-channel latching transistor 35' is provided, having its source-to-drain path connected between the input of inverter 36 and $V_{cc}$, and having its gate connected to the output of inverter 38. Repeater 16a' may be more efficient to layout than repeater 16a of FIG. 5a, since transistors 34 and 35' are both n-channel, and may be included within the same active region. It should be noted that this layout efficiency of repeater 16a' is achieved at a cost of having less than a full $V_{cc}$ level presented to the input of inverter 36, since a threshold voltage drop from $V_{cc}$ is presented by transistor 35' to the input of inverter 36 in repeater 16a'. It is contemplated that the selection between these and other alternatives may be made by one of ordinary skill in the art, depending upon the particular design, layout and processing constraints of the circuit application.

It should be noted that the alternatives of FIGS. 5a and 5b are most appropriately used in clocked memories, especially those with relatively high clocking frequencies. In repeaters 16a and 16a', the input of inverter 36 will be floating for the unselected rows in the selected sub-array 12, since transistors 32 and 34 are off, and since the latching transistors 35 and 35' are off, for unselected rows in selected sub-arrays. Accordingly, so long as the length of time that the input of inverters 36 is floating is limited, such as is the case where the cycle time is relatively short, the alternative arrangements of repeaters 16a and 16a' of FIGS. 5a and 5b, respectively, allow implementation of the latched repeater with one fewer transistor than that of repeater 16 of FIG. 3.

Figure 6:
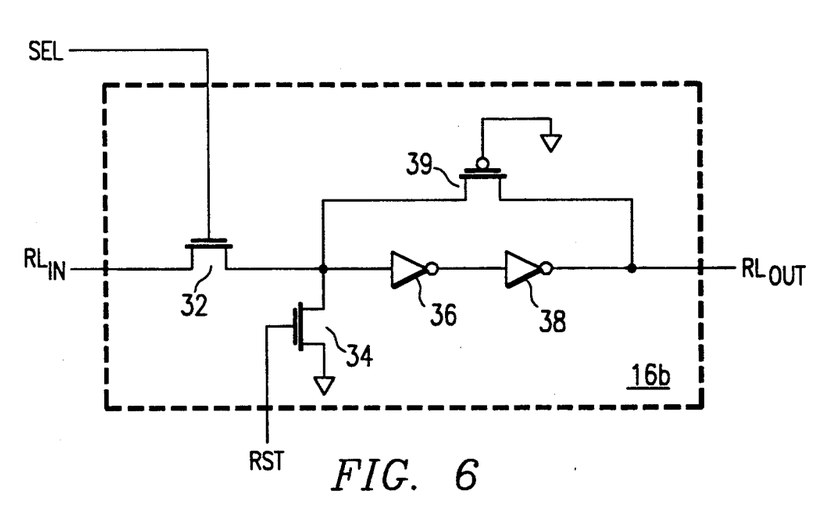
FIG. 6 is an electrical diagram, in schematic form, of a fourth alternative embodiment of the latched repeater of FIG. 2.

Referring to FIG. 6, repeater 16b according to another embodiment of the invention is illustrated. Repeater 16b further includes, in addition to pass transistor 32, discharge transistor 34, and inverters 36 and 38 in the same configuration as in repeaters 16 and 16a. Also provided in repeater 16b is p-channel latching transistor 39 having its source-to-drain path connected between the output of inverter 38 and the input of inverter 36. Transistor 39 is preferably much smaller than transistor 34, so that transistor 34 can pull down the input of inverter 36 when line RST is high. With pass transistor 32 off, and with line RST low, transistor 39 will connect the high level at the output of inverter 38 to the input of inverter 36, latching the selected state onto line $RL_{out}$.

Figure 7:
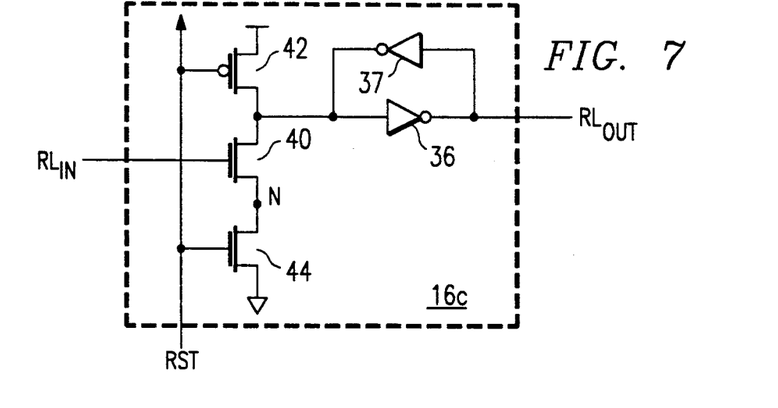
FIG. 7 is an electrical diagram, in schematic form, of a fifth alternative embodiment of the latched repeater of FIG. 2.

Referring now to FIG. 7, repeater 16c according to another alternative embodiment of the invention will now be described. Repeater 16c includes a latch comprised of inverter 36 and weak inverter 37, cross-coupled with one another, similarly as repeater 16 of FIG. 3. For repeater 16c of FIG. 7, no buffering inverter 38 is necessary, due to the inverting operation of the remainder of the circuit as will be apparent from this description. Accordingly, the output of inverter 36 directly drives row line $RL_{out}$.

Repeater 16c further includes p-channel transistor 42, and n-channel transistors 40 and 44, all having their source-to-drain path connected in series between $V_{cc}$ and ground, with n-channel transistor 40 connected in series between transistors 42 and 44. The input of inverter 36 is connected to the drains of transistors 42 and 40; the node at the source of transistor 40 and the drain of transistor 44 is designated in FIG. 7 as node N. It should be noted that node N for multiple repeaters 16c associated with the same sub-array 12 may be connected together, so that a single transistor 44 may serve multiple repeaters 16c. The gate of transistor 40 receives row line $RL_{in}$, and the gates of transistors 42 and 44 receive line RST from column decoder 16. The logic for driving line RST from the column address bits may be the same as that shown in FIG. 2 (i.e., NAND gates 30), together with such additional timing logic as required to perform the operation described herein, a preferred example of which will now be described relative to FIG. 9.

It should be noted that the location of transistors 40 and 44 in series between the input of inverter 36 and ground may be exchanged if desired, i.e., with the drain of transistor 44 being connected to the input of inverter 36 and with the source of transistor 40 being connected to ground. In such an alternative arrangement, the functionality of repeater 16c is equivalent to that of repeater 16c shown in FIG. 7. However, transistor 44 may not be shared among multiple repeaters if the locations of transistors 40 and 44 are exchanged from that shown in FIG. 7, as such sharing would cause one row line signal $RL_{in}$ to energize all row lines $RL_{out}$ for the sub-array 12 with which the repeaters 16c are associated.

The timing of the return of line RST to a low logic level for the repeaters 16c associated with the unselected sub-arrays 12 must be such that the selected row line RL is enabled along its full length prior thereto. As memory devices become larger in density, and especially as the feature sizes such as the physical width of row lines RL become smaller, the RC delay along the row lines RL from row decoder 14 to the far end can be significant. Assurance and control of line RST from timing and control circuitry 22 may be done by modeling and characterization of the row line RC delay, with sufficient delay provided so that line RST does not return to a low logic level too early.

Figures 8, 9:
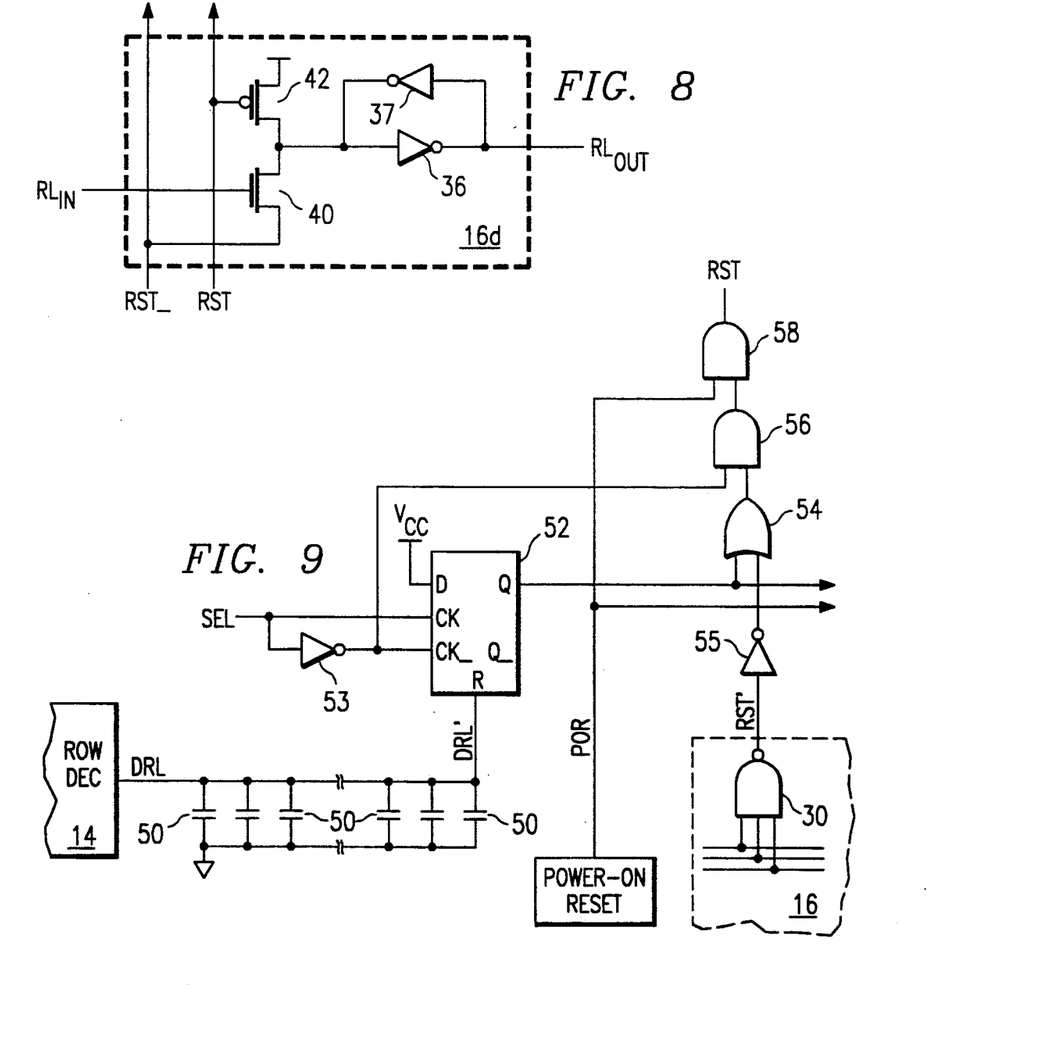
FIG. 8 is an electrical diagram, in schematic form, of a sixth alternative embodiment of the latched repeater of FIG. 2.
FIG. 9 is an electrical diagram, in schematic form, of a preferred embodiment of control circuitry for controlling the latched repeaters.

In order to reduce the active power consumption as much as possible, however, it is preferable to cause line RST to return to a low logic level as soon as possible. Accordingly, a penalty in active power dissipation results from designing the timing of line RST too conservatively. Referring now to FIG. 9, a preferred embodiment of circuitry for actively determining the time at which line RST is to return low, for unselected sub-arrays 12, will be described.

In this embodiment, row decoder 14 not only drives the row lines RL, but also drives a dummy row line DRL. Dummy row line DRL is connected to one plate of a number of capacitors 50, each capacitor emulating the gate capacitance of a pass transistor 28 in the memory sub-arrays 12. Preferably, capacitors 50 are implemented with the same geometry and construction as pass transistors 28, with the number of capacitors 50 equalling the number of pass transistors 28 connected to each row line RL in sub-arrays 12. With such equivalent construction, changes in the fabrication process, such as actual feature sizes, will be equally reflected for capacitors 50 as for pass transistors 28. In this construction, the number of capacitors 50 will be equal to the number of pass transistors 28 along the full length of a row (e.g., 1024 capacitors 50 for a half-row of 512 memory cells on one side of row decoder 14 in memory 1 of FIG. 1). In addition, the physical characteristics, such as line width, line length, and material, of dummy row line DRL is the same as an actual row line RL, so that the resistance of dummy row line RL is the same as an actual row line RL.

Alternatively, a single capacitor having the same capacitance as the pass transistors 28, connected to a resistive line having the same resistance as a row line RL, may be used to conserve layout area. The accuracy of the timing result will depend, for such an alternative, on the accuracy of the single-capacitor single-resistor network to match the RC delay of an actual row line.

The end of dummy row line DRL, at the node DRL', is connected to a reset input of a D-type flip-flop 52. The D input of flip-flop 52 is connected to $V_{cc}$. The clock and complement clock inputs of flip-flop 52 are driven by line SEL, and line SEL inverted by inverter 53, respectively. Line SEL is driven by timing and control circuitry 22, in this embodiment, with similar timing as described hereinabove in FIG. 4. The output of inverter 53, with the complementary state of line SEL, is also connected to an input of AND gate 56.

The output of each of NAND gates 30 (only one of which is shown in FIG. 9) is connected, via inverter 55, to one input of OR gate 54 which has its other input connected to the Q output of flip-flop 52. The output of OR gate 54 is connected to a second input of AND gate 56.

In this embodiment, line POR from power-on reset circuitry is connected to one input of AND gate 58, which has its other input connected to the output of AND gate 56. The output of AND gate 58 is line RST for the particular group of repeaters 16c, in this embodiment. The use of power-on reset circuitry 24, indicating on line POR with a high logic level, for example, that power-up has been achieved, with repeaters 16c precludes the selection of multiple row lines RL during power-up. With line POR low during power-up, line RST will be low for all repeaters 16. Referring to FIG. 7, this causes all row lines $RL_{out}$ to be at low logic levels, since transistor 42 is turned on for all repeaters 16b, presenting a high logic level at the input of inverter 36 (overcoming weak feedback inverter 37) and causing a low logic level at the output of inverter 36 on all lines $RL_{out}$. This embodiment of the invention thus actively disables all row lines RL in memory 1 during power-up, preventing the selection of multiple row lines RL and the resulting massive and destructive power dissipation that can result, for example when memory cells 26 having opposite data states are connected to the same bit line pair.

It should of course be noted that use of line POR to disable all row lines RL may similarly be incorporated into the embodiment of FIGS. 3, for example by logically combining the RST lines with line POR so that all transistors 34 in repeaters 16 are turned on during power-up, forcing a low logic level on all row lines.

The operation of repeater 16c, controlled according to the preferred embodiment of the control logic in FIG. 9, will now be described. At the beginning of a memory cycle in this example, row decoder 14 drives all row lines RL to a low logic level, as is conventional. Also at this time, line SEL goes to a high logic level. This causes line RST (assuming line POR is high) to go to a low logic level for all repeaters 16c, via AND gate 56. This causes transistors 42 in all repeaters 16c to conduct, placing the inputs of all inverters 36 at a high logic level. All row lines $RL_{out}$ driven by repeaters 16c are thus placed into the low, non-enabled, logic state. In addition, a high logic level is clocked into flip-flop 52 by line SEL going to a high logic level.

Line SEL then returns to a low logic level which allows the output of AND gate 56 to be determined by the logical OR of the output of flip-flop 52 and NAND gate 30 (inverted). Since a high logic level has been clocked into flip-flop 52, lines RST are driven to a high logic level, turning off transistors 42 and turning on transistors 44. Since all row lines are at a low logic level (either from row decoder 14 or from repeaters 16c), the inputs of all inverters 36 are maintained at a high logic level by the operation of weak inverter 37.

After decoding of the row address by row decoder 14, the selected row line $RL_{in}$ is driven to a high logic level. With transistor 44 on and transistor 42 off, transistor 40 will connect the input of inverter 36 for the repeaters 16c associated with the selected row to be discharged to ground through transistors 40 and 44. This will change the state of inverter 36, due to latching inverter 37 being weak relative to transistors 40 and 44, so that a high, enabling, logic level is driven on row line $RL_{out}$ by repeaters 16c associated with the selected row.

In the embodiment of FIGS. 7 and 9, line RST will remain high for all repeaters 16c until such time as dummy row line DRL' remains low, i.e., during the time required for the high logic level to propagate along the length of a full row line. Upon dummy row line DRL' reaching a high logic level, flip-flop 52 will be reset, so that its Q output returns to a low logic level. Accordingly, the output of NAND gate 30 (via inverter 55) will determine the state of line RST. Accordingly, for the non-selected sub-arrays 12, the output of NAND gate 30 is high, which causes line RST to be taken to a low logic level. The repeaters 16c associated with the selected row in non-selected sub-arrays 12 will have the input of their inverters 36 driven to a high logic level, due to transistors 42 in such repeaters 36 being conductive. This causes row lines $RL_{out}$ for non-selected sub-arrays 12 to be de-energized.

Conversely, for the selected sub-array 12, line RST remains at a high logic level due to the output of NAND gate 30 being low, so that a high logic level is presented to OR gate 54 (line SEL being low at this time). Transistors 42 in repeaters 16c associated with the selected sub-array 12 thus remain off. If the selected sub-array 12 is adjacent to row decoder 14, row line $RL_{in}$ will continue to be driven high by row decoder 14, so that transistor 40 will remain on to pull down the input to inverter 36 via transistor 44, also remaining on. For the repeater 16c which is associated with the selected row and with a selected sub-array 12 which is not adjacent to row decoder 14, row line $RL_{in}$ will be driven to a low logic level from the prior repeater 16c. This will turn transistor 40 in repeater 16c off, and with transistor 42 also off, weak inverter 37 will maintain the low logic level at the input to inverter 36 so that row line $RL_{out}$ remains at a high, energized, state.

As noted hereinabove, it is also desirable to time out the row line RL in the selected sub-array 12, in order to further reduced the power dissipation. Such timing out of the row line may be done according to conventional techniques, such as de-energizing the row line after the sense amplifiers 13 have been clocked, i.e., have sensed and latched the state of the bit lines connected thereto.

It is believed that repeater 16c will provide certain advantages relative to repeaters 16, 16a and 16b described hereinabove. First, only one signal line RST is necessary, rather than the two signal lines SEL and RST required for the prior described embodiments. This results in a reduced number of drivers required for memory 1, and accordingly in less layout area (due not only to fewer drivers, but to the reduced number of lines). Secondly, the sequencing of the operation of repeaters 16c is simpler, since isolation of the input node in all repeaters 16 is not required. Third, the circuit is implemented with fewer transistors, especially considering the sharing of transistors 44 among multiple repeaters 16c. Finally, it is believed that repeater 16c provides additional stability of operation, since the potential for source follower action (which is especially sensitive to process variation such as threshold voltage, body effect, and size ratios of p-channel to n-channel transistors) is minimized. Accordingly, the demands on the weak feedback inverter 37 are reduced due to pull-up transistor 42 for the non-selected rows, and heavy crowbar current in repeater 16c is substantially avoided.

Referring now to FIG. 8, repeater 16d according to yet another alternative embodiment of the invention will be described. Repeater 16d differs from repeater 16c by eliminating n-channel pull-down transistor 44; line RST_ is connected to the source of transistor 40, while line RST is connected to the gate of p-channel transistor 42. Line RST is at a high logic level (and line RST_ is low) responsive to the selection of the sub-array 12 with which the particular repeater 16d is associated. Operation of repeater 16d is similar to that of repeater 16c, with all lines RST going low (and lines RST_ going high) at the beginning of the memory cycle so that all row lines $RL_{out}$ are reset to a low logic level. For the selected row, row line $RL_{in}$ is driven high, turning on transistor 40 and discharging the input of inverter 36 to the low logic level driven on line RST_.

After the period of time required for full selection of the memory cells in the selected row, line RST will go to a low logic level for those repeaters 16d associated with non-selected sub-arrays 12. Transistors 42 will turn on for those repeaters 16d, pulling the input of inverters 36 high (overcoming weak inverters 37), and thus placing a low logic level on row lines $RL_{out}$. For the repeater 16d associated with the selected row and selected sub-array 12, line RST will remain high so that transistor 42 is not turned on. Even if row line $RL_{in}$ goes low, as is the case where repeater 16d is not adjacent row decoder 14, this will allow inverter 37 to maintain a low logic level at the input of inverter 36, so that row line $RL_{out}$ remains high for the selected row in the selected sub-array 12. Of course, if repeater 16d is adjacent row decoder 14, row line $RL_{in}$ may be maintained at a high logic level, with the same output on row line $RL_{out}$.

The alternative embodiment of FIG. 8 provides the benefits of repeaters 16c described hereinabove, and may be implemented with one fewer transistor than the alternative of repeaters 16c, although at the cost of an additional line required for line RST. Accordingly, choice between the implementations of repeaters 16c and 16d will depend upon the particular layout constraints of memory 1.

For each of the embodiments described hereinabove, the implementation in an integrated circuit having a memory provides for reduced active power dissipation, as the portions of the row line associated with the selected row, but not associated with the selected sub-array, or block, may be turned off. Furthermore, such reduction in power dissipation is achieved while still allowing access to the selected memory cell (and those nearby in the same row), so that a later write operation may be performed without the use of transition detection and the like. Furthermore, the layout impact of additional row decoders is avoided in the embodiments described hereinabove, without double level metallization, or another conductive layer, as required in the case of a main word line connected in parallel with multiple section word lines and decoding, as described in the Sakurai et al. article cited hereinabove.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A semiconductor memory, comprising:
   a plurality of memory cells arranged in rows and columns, each of said rows associated with one of a plurality of row lines, said memory cells grouped into first and second sub-arrays;
   a row decoder, for selecting a row of memory cells by energizing one of said row lines according to a row address value;
   a power-on reset circuit, connected to a power supply terminal, having an output presenting a first logic state responsive to the voltage at said power supply terminal having a magnitude less than a threshold level, and presenting a second logic state responsive to the voltage at said power supply terminal having a magnitude greater than said threshold level;
   a plurality of first row line repeaters, each coupled to a row line from said row decoder at an input, and each having an output coupled to a first local row line for selecting a row of memory cells in said first sub-array;

a plurality of second row line repeaters, each coupled to a first local row line from a respective one of said first row line repeaters at an input, and each comprising means for retaining the energizing state of the respective one of said plurality of first local row lines at its input and having an output coupled to a second local row line for selecting a row of memory cells in said second sub-array;

a column decoder, for selecting a sub-array according to a portion of a column address value, said column decoder having a first reset line connected to said plurality of first row line repeaters, and having a second reset line connected to said plurality of second row line repeaters, said first and second reset lines indicating with a first logic state that the first or second sub-array, respectively, is not selected;

timing and control circuitry, having an output for driving a select line;

wherein each of said second row line repeaters disconnects from its input responsive to said timing and control circuitry driving said select line to a first logic level;

wherein said timing and control circuitry drives said select line to said first logic level after the second row line has been energized for the selected row; and circuitry for de-energizing said row lines responsive to the output of said power-on reset circuit being at said first logic state;

wherein the first row line repeater associated with the row selected by the row decoder de-energizes the one of said plurality of first local row lines at its output responsive to the reset line connected thereto indicating that the first sub-array is not selected.

2. The memory of claim 1,
wherein said first and second row line repeaters are coupled to the output of said power-on reset circuit, so that said first and second local row lines are de-energized responsive to the output of said power-on reset circuit being in its first logic state.

3. The memory of claim 2, wherein the one of said first and second row line repeaters associated with a row selected by the row decoder de-energizes its output responsive to the associated first or second reset line connected thereto indicating that its associated sub-array is not selected.

4. The memory of claim 3, wherein said column decoder drives, to the first logic state, one of said first and second reset lines associated with a sub-array which is not selected after a second local row line has been energized for the selected row.

5. The memory of claim 3, wherein each of said first and second row line repeaters comprises:
a pass transistor, having its source-to-drain path connected to one side to the input, and having its gate controlled by said select line;
a latch, having its input coupled to the other side of the pass transistor, and having an output; and
a discharge transistor, having its source-to-drain path connected between the input of the latch and a reference voltage node, and having its gate controlled by its associated reset line, said discharge transistor being conductive when its associated reset line is at its first logic state.

6. The memory of claim 3, wherein each of said first row line repeaters comprise:
a first transistor, having a conduction path connected between a first node and a discharge node, and having a control terminal coupled to a row line;
a first latch, having an input connected to said first node and having an output driving a first local row line;
a first deselect transistor, having a conductive path connected between a bias voltage and said first node, and having a control terminal for receiving said reset line, said first deselect transistor being conductive responsive to said reset line at a first logic level, said bias voltage being at a level such that, when applied to the input of said first latch, said first local row line is at a logic level disabling selection of memory cells associated therewith; and
first means for connecting said discharge node to a reference voltage, said reference voltage being at a level such that, when applied to the input of said first latch, said first local row line is at a logic level enabling selection of memory cells associated therewith;

and wherein each of said second row line repeaters comprise:
a second transistor, having a conduction path connected between a second node and a second discharge node, and having a control terminal coupled to its associated first local row line;
a second latch, having an input connected to said second node and having an output driving a second local row line;
a second deselect transistor, having a conductive path connected between a bias voltage and said second node, and having a control terminal coupled to said second reset line, said second deselect transistor being conductive responsive to said second reset line at a first logic level, said bias voltage being at a level such that, when applied to the input of said second latch, said second local row line is at a logic level disabling selection of memory cells associated therewith; and
second means for connecting said second discharge node to a reference voltage, said reference voltage being at a level such that, when applied to the input of said first latch, said second local row line is at a logic level enabling selection f memory cells associated therewith.

7. The memory of claim 3, wherein said memory cells are grouped into first, second, third and fourth sub-arrays;
and further comprising:
a plurality of third row line repeaters, each receiving a second local row line at an input, and each presenting at an output at a third local row line for selecting a row of memory cells in said third sub-array; and
a plurality of fourth row line repeaters, each receiving a third local row line at an input, and each presenting at an output a fourth local row line for selecting a row of memory cells in said fourth sub-array;
wherein said column decoder also has a third reset line connected to said plurality of third row line repeaters, and a fourth reset line connected to said plurality of fourth row line repeaters, said third and fourth reset lines also indicating, with a first logic state, that the third or fourth sub-array, respectively, is not selected.

8. The memory of claim 1, wherein the memory cells are random access memory cells.

9. The memory of claim 3, wherein the memory cells in a selected row are each connected to one of a plurality of bit lines responsive to its associated local row line being energized;

and further comprising:

a sense amplifier for sensing and latching a data state on one of the bit lines.

10. The memory of claim 9, wherein the reset line associated with a selected sub-array is driven to said first logic state responsive to the sense amplifier latching the data state on the bit lines.

11. A method of controlling an integrated memory circuit having an array of memory cells arranged in rows and columns, and grouped in a plurality of sub-arrays, each row of memory cells associated with and selectable by a row line having a plurality of portions each corresponding to one of said sub-arrays, comprising the steps of:

detecting whether or not the voltage at a power supply terminal has a magnitude above a threshold limit;

responsive to detecting that the voltage at the power supply terminal has a magnitude below said threshold limit, deenergizing all row lines in said memory array;

responsive to detecting that the voltage at the power supply terminal has a magnitude above said threshold limit, energizing a selected row line;

decoding a portion of a column address signal for selecting one of said sub-arrays; after said energizing step, for each row line, isolating, from one another, first and second portions associated with adjacent sub-arrays; and after said energizing step, de-energizing the portions of the selected row line for each of said plurality of sub-arrays not selected in said decoding step while maintaining as energized the portion of the selected row line for the sub-array selected in said decoding step.

12. The method of claim 11, further comprising:

after said energizing step, and before said isolating step, latching the energized state of each of said portions of the selected row line.

13. The method of claim 12, wherein said de-energizing step comprises:

after said isolating step, changing the latched state for a portion of the selected row line associated with a sub-array not selected in said decoding step.

* * * * *